(12) United States Patent
Kawatani

(10) Patent No.: US 6,184,543 B1
(45) Date of Patent: *Feb. 6, 2001

(54) OPTICAL SEMICONDUCTOR DEVICE AND METHOD FOR FABRICATING THE SAME

(75) Inventor: Atsuhiro Kawatani, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/067,006

(22) Filed: Apr. 27, 1998

(30) Foreign Application Priority Data

Apr. 28, 1997 (JP) .................................... 9-122874

(51) Int. Cl.[7] .................................................. H01L 33/00
(52) U.S. Cl. ................................................ 257/98; 257/99
(58) Field of Search ............................. 257/98, 99, 80, 257/81, 82–84, 443

(56) References Cited

U.S. PATENT DOCUMENTS 4,897,711 * 1/1990 Blonder et al. .................... 257/98
4,989,935 * 2/1991 Stein ................................... 257/81
5,412,748 * 5/1995 Furuyama et al. .................. 257/98
5,909,523 * 6/1999 Sakaino et al. ..................... 385/49

FOREIGN PATENT DOCUMENTS

| 62-13088 | 1/1987 | (JP) . |
| 63-75063 | 5/1988 | (JP) . |
| 1-130112 | 5/1989 | (JP) . |
| 4-102810 | 4/1992 | (JP) . |
| 7-43542 | 2/1995 | (JP) . |

OTHER PUBLICATIONS

K. Yamauchi et al., "A Surface Mountable Optical Module for Subcriber Network", Proceedings of The 1996IEICE General Conference, Electronics–1, SC2–7, pp. 442–443, Mar. 38–31, 1996.

* cited by examiner

Primary Examiner—Tom Thomas
Assistant Examiner—Thien F. Tran
(74) Attorney, Agent, or Firm—McGinn & Gibb, PLLC

(57) ABSTRACT

Disclosed is an optical semiconductor device which has: an optical semiconductor element; and a semiconductor element region provided as a peripheral circuit for the optical semiconductor element; wherein the optical semiconductor element is mounted on a semiconductor substrate that includes the semiconductor element region.

20 Claims, 2 Drawing Sheets

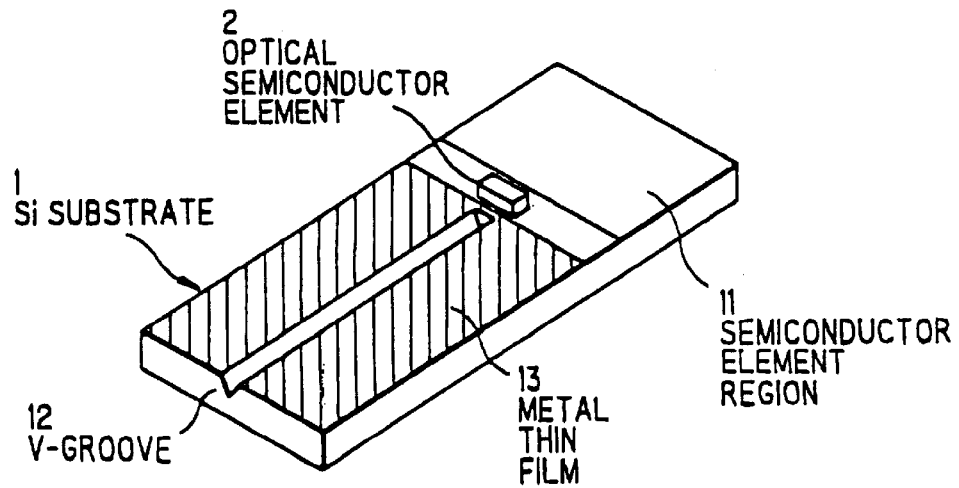

OPTICAL SEMICONDUCTOR DEVICE AND METHOD FOR FABRICATING THE SAME

FIELD OF THE INVENTION

This invention relates to an optical semiconductor device for optical communications, and, more particularly to, the mount structure of an optical semiconductor device, and relates to a method for fabricating the optical semiconductor device.

BACKGROUND OF THE INVENTION

An example of the conventional mount structure of an optical semiconductor device is reported in K. Yamauchi et al., "A Surface Mountable Optical Module for Subscriber Network", Proceedings of the 1996 IEICE General Conference, Electronics-1, SC-2-7, pp.442–443(1996). In this example, an optical semiconductor element (PD element) and a semiconductor element (preamplifier) are mounted as pair chips so as to provide the minimization and to enhance the function and productivity.

However, in the conventional optical semiconductor device, the substrate to mount the optical semiconductor element is mounted being separated from the semiconductor element substrate to drive the optical semiconductor element. Therefore, a clearance to insert a mounting jig when mounting the substrates is required, thereby increasing the entire size of the optical semiconductor device. Also, the bonding wire to connect between the substrates must be lengthened that much, thereby increasing the wire inductance and thus preventing the device from operating at a higher speed. Further, due to the separated structure, the number of parts must be increased and the productivity must be lowered.

SUMMARY OF THE INVENTION

Accordingly, it is an object of the invention to provide an optical semiconductor device that is further minimized and has an enhanced operation speed and productivity.

It is a further object of the invention to provide a method for fabricating an optical semiconductor device that is further minimized and has an enhanced operation speed and productivity.

According to the invention, an optical semiconductor device, comprising:

an optical semiconductor element; and a semiconductor element region provided as a peripheral circuit for the optical semiconductor element;

wherein the optical semiconductor element is mounted on a semiconductor substrate that includes the semiconductor element region.

According to another aspect of the invention, a method for fabricating an optical semiconductor device, comprising the steps of:

depositing metal thin film on a silicon substrate where a semiconductor element region provided as a peripheral circuit for an optical semiconductor element is in advance formed by using a silicon semiconductor process;

further coating it with photoresist film;

conducting its exposure and development to expose the metal thin film at parts where to form a mark for positioning the optical semiconductor element and a V-groove for holding an optical fiber;

removing the exposed metal thin film by etching to expose the silicon substrate;

conducting anisotropic etching to the exposed silicon substrate to form the V-groove for holding the optical fiber; and mounting the optical semiconductor element on the silicon substrate by using the positioning mark.

BRIEF DESCRIPTION OF THE DRAWINGS

The invention will be explained in more detail in conjunction with the appended drawings, wherein:

FIGS. 3A to 3H are cross sectional views showing a method for fabricating the optical semiconductor device in FIG. 2, and FIG. 4 is a perspective view showing an optical semiconductor device in a second preferred embodiment according to the invention.

DESCRIPTION OF THE PREFERRED EMBODIMENTS

Before explaining a semiconductor optical modulator in the preferred embodiments, the aforementioned conventional optical switch will be explained in FIG. 1.

Figure 1:
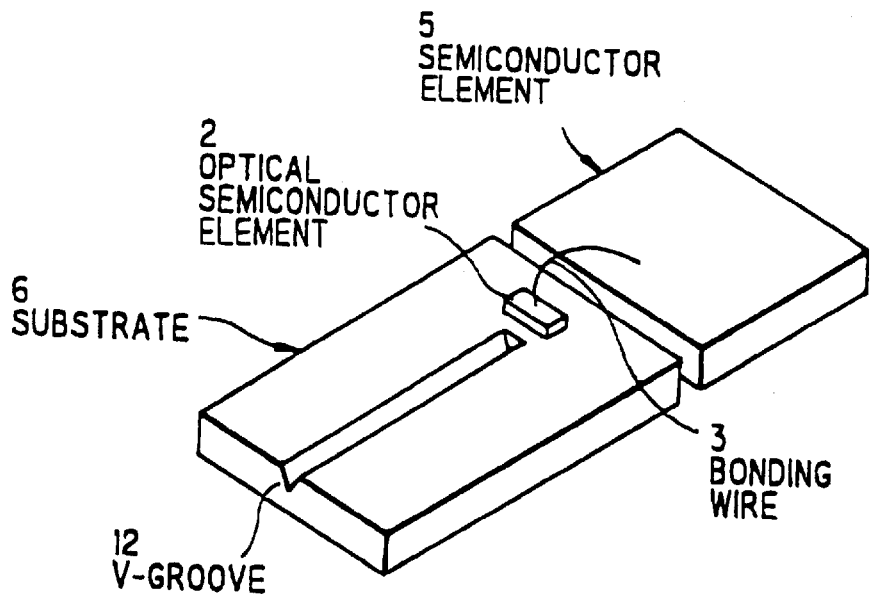
FIG. 1 is a perspective view showing a conventional optical semiconductor device.

FIG. 1 is a perspective view showing the mount structure of a conventional optical semiconductor device. Referring to FIG. 1, a V-groove 12 is formed on a substrate 6 on which an optical semiconductor element 2 is mounted. By holding an optical fiber (not shown) in the V-groove 12, the optical fiber and the optical semiconductor element 2 can be optically connected. A semiconductor element 5 for driving the optical semiconductor element 2 is disposed adjacent to the substrate 6 on the opposite side of the V-groove 12 and is electrically connected with the optical semiconductor element 2 through a bonding wire 3.

Next, an optical semiconductor device in the first preferred embodiment will be explained in FIG. 2, wherein like parts are indicated by like reference numerals as used in FIG. 1.

As shown, a semiconductor element region 11 for driving an optical semiconductor element 2 is formed on a silicon substrate 1 by a semiconductor fabrication process described later. Also, a V-groove 12 is formed at a place where an optical fiber to be held thereinto connects optically with the optical semiconductor element 2 on the silicon substrate 1.

The V-groove 12 is designed so that part of the optical fiber can be dropped thereinto by a little less than half the diameter of the optical fiber under the surface of the silicon substrate 1. Thereby, the height of the core of the optical fiber above the surface of the silicon substrate 1 can correspond to the height of the light-emitting part of the optical semiconductor element 2 when holding the optical fiber thereinto.

The silicon substrate 1 can be fabricated with the semiconductor element region 11 for driving the optical semiconductor element 2 by a series of steps in the semiconductor fabrication process, while the V-groove 12 can be easily and precisely formed by anisotropic etching on the silicon substrate 1.

The optical semiconductor element 2 is fixed on the silicon substrate 1. On the surface of the silicon substrate 1, there are formed metal thin film 13 for blocking infrared rays except the V-groove 12 and a circle mark (not shown) for positioning the optical semiconductor element 2. Also, on the optical semiconductor element 2, there is formed circular thin film for blocking infrared rays with a diameter less than that of the circle mark at a region corresponding to the circle mark. In mounting the optical semiconductor element 2 on the silicon substrate 1, a contour figure formed by the boundary of the circle mark on the silicon substrate 1 and a contour figure formed by the boundary of the circular thin film formed on the mount surface of the optical semiconductor element 2 are detected by projecting infrared rays on them. Then, the positioning of the optical semiconductor element 2 on the silicon substrate 1 is conducted by overlapping both the detected contour figures, thereby detecting a doughnut-like infrared ring.

thus, by detecting the relative position between the contour figure on the silicon substrate 1 and the contour figure on the optical semiconductor element 2, they can be positioned without requiring the light-emitting of the optical semiconductor element 2, then joined to each other. Meanwhile, the above-mentioned contour figures are not limited to circles and can be the other proper shapes. The forming of thin film and the patterning of the mark can be easily and precisely by depositing metal film and then conducting its photolithography.

Meanwhile, silicon or compound materials used to form the optical semiconductor element, such as InGaAs and InP have the property that infrared rays are transmitted through. Therefore, by using an infrared-blocking material such as metal to form the thin film on the mount surface of the optical semiconductor element 2, the contour figures for positioning can be detected by projecting infrared rays onto the upper surface of the optical semiconductor element 2 or onto the lower surface of the silicon substrate 1.

The optical semiconductor element 2 is electrically connected through the bonding wire 3 with the semiconductor element region 11 for driving the optical semiconductor element 2 to be formed next to the optical semiconductor element 2 on the silicon substrate 1. The electrical connection between the optional semiconductor element 2 and the semiconductor element region 11 can be conducted by flip chip bonding that joins the electrode pad of the optical semiconductor element 2 to the electrode pad of the semiconductor element region, other than by using the bonding wire.

The optical semiconductor device of the invention may be provided with both light-emitting and light-receiving functions by using e.g., and end-face-incidence type light-receiving element as the optical semiconductor element 2 in place of the light-emitting element and further using a semiconductor element region for peripheral circuit, such as for amplification or detection, other than the semiconductor element region for driving the optical semiconductor element 2.

Next, referring to FIGS. 3A to 3H, the fabrication process of the optical semiconductor device in the first embodiment will be explained. The semiconductor element region 11 for driving the optical semiconductor element 2 is in advance formed by silicon semiconductor process on the silicon substrate 1 (FIG. 3A). Then, metal thin film is deposited on the silicon substrate 1, and then resist 4 for patterning by photolithography and for protecting the semiconductor element region 11 is coated thereon (FIG. 3B). Then, by conducting the exposure and development, metal film regions corresponding to the mark for positioning the optical semiconductor element 2 and the V-groove 12 for holding the optical fiber are exposed (FIG. 3C). Then, the exposed metal film regions are removed by conducting the etching process, and then the V-groove 12 is formed by isotropic etching on the silicon substrate 1 (FIG. 3D).

Then, after removing the resist 4, the optical semiconductor element 2 is mounted on the silicon substrate 1 while positioning by using the above-mentioned technique (FIGS. 3E, 3F). After mounting, the electrode of the optical semiconductor element 2 is connected through the bonding wire to the semiconductor element region 11 (FIGS. 3G, 3H). The other wiring (+ or −) is connected through the electrode formed in the mounting on the substrate.

An optical semiconductor device in the second preferred embodiment will be explained in FIG. 4. In the second embodiment, the optical semiconductor element 2 is mounted on the semiconductor element region 11 for driving the optical semiconductor element 2. The electrode pad of the semiconductor element region 11 is formed nearly as big as the electrode of the optical semiconductor element 2, so that the optical semiconductor element 2 can be directly mounted and electrically connected to the semiconductor element region 11. The mark for positioning can be formed simultaneously when the electrode pad is formed. Alternatively, the positioning mark may be formed together with the pattern for the V-groove 12 by forming metal thin film 13 also at a region to mount the optical semiconductor element 2 except at the region where the electrode pad is formed of the semiconductor element region 11 and then conducting the exposure and development process and the etching process as described in the first embodiment. Thereby, the positioning precision between the V-groove 12 and the optical semiconductor element 2 can be enhanced.

In the second embodiment, the interconnection length can be further shortened, thereby minimizing the entire device size, increasing the operation speed and enhancing the productivity due to removing the wiring process of bonding wire.

A specific example of the optical semiconductor device in the first embodiment will be explained below.

Figure 2:
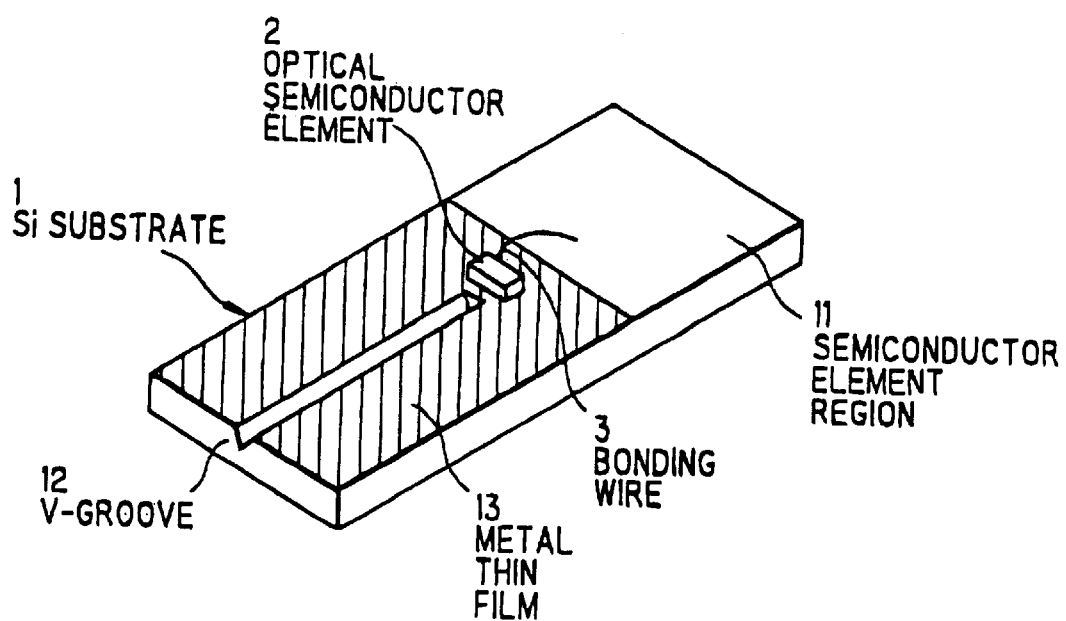
FIG. 2 is a perspective view showing an optical semiconductor device in a first preferred embodiment according to the invention.

As shown in FIG. 2, the semiconductor element region 11 for driving the optical semiconductor element 2 is in advance formed by silicon semiconductor process on the silicon substrate 1. The optical semiconductor element 2 is mounted with the junction to face on the front surface of the substrate next to the semiconductor element region 11. As the optical semiconductor element 2, a 1.31 $\mu$m optical semiconductor laser of InGaAsP—system compound is used and the chip size is about 300 square $\mu$m.

The silicon substrate 1 is of silicon and has two circle marks formed on the surface by removing the metal thin film so as to detect the position to mount the optical semiconductor element 2, i.e., the position where the optical semiconductor element 2 is to connect optically with an optical fiber to be held in the V-groove 12 when the optical semiconductor element 2 is mounted on the silicon substrate 1. The metal thin film is of CrPtAu, and the circle marks have a diameter of 30 $\mu$m and are laterally disposed with an interval of 200 $\mu$m. Also, two circular thin films with a diameter a litter less than that of the circle mark are formed on the mount face of the optical semiconductor element 2.

the positioning of the optical semiconductor element 2 to the silicon substrate 1 is conducted by projecting infrared rays from a position over the optical semiconductor element 2, detecting a doughnut-like transmitting-light ring to be formed by the circle marks on the silicon substrate 1 and the thin films on the optical semiconductor element 2 at a position under the back surface of the silicon substrate 1.

On the other hand, the V-groove 12 to hold the optical fiber is formed by anisotropic etching on a line equidistant from the two circle marks on the silicon substrate 1. The anisotropic etching to silicon is generally conducted by patterning a non-etched region with metal film by using photolithography technique, dipping it into an etching solution while using this pattern as an etching mask.

This mask and the circle marks can be formed using the same metal thin film so as to conduct in common the processes for them. Thereby, the process can be simplified. Moreover, the positioning precision can be greatly enhanced since the relative positioning precision between the V-groove 12 and the circle marks depends upon only the precision of the photolithography mask to be patterned.

The opening width and the depth of the V-groove 12 are set so that, when the optical fiber is disposed into the V-groove 12, the core height from the surface of the silicon substrate 1 can correspond to the height of the light-emitting part of the optical semiconductor element 2. Also, the positions of the circle marks and the center-line position of the V-groove 12 are preset by patterning so that the optical axis of the optical semiconductor element 2 can correspond to that of the optical fiber when the optical semiconductor element 2 is mounted. For example, the height of the light-emitting part of the optical semiconductor element 2 when the optical semiconductor element 2 is mounted on the silicon substrate 1 is set to be 5 $\mu$m from the surface of the substrate 1. To regulate the core height of the optical fiber with a diameter of 125 $\mu$m to the height of the light-emitting part, the opening width and the depth of the V-groove 12 are set to be 142 $\mu$m and 80 $\mu$m, respectively.

Furthermore, the electrode of the upper surface of the optical semiconductor element 2 is connected through the binding wire 3 with the electrode of the semiconductor element region 11 for driving the optical semiconductor element 2.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An optical semiconductor device, comprising:
   a continuous semiconductor substrate having an optical element region and a semiconductor element region;
   an optical semiconductor element positioned over said optical element region;
   a peripheral circuit for said optical semiconductor element positioned over said semiconductor element region;
   a V-notch within said optical element region; and
   a metal film which extends over all of said optical element region except in said V-groove and under said optical semiconductor element.

2. An optical semiconductor device, according to claim 1, wherein:
   said optical semiconductor element is directly mounted on said semiconductor element region.

3. An optical semiconductor device, according to claim 1, wherein:
   said V-groove is adapted to hold an optical fiber to be optically connected with said optical semiconductor element.

4. An optical semiconductor device, according to claim 2, wherein:
   said V-groove is adjusted to hold an optical fiber to be optically connected with said optical semiconductor element.

5. An optical semiconductor device, according to claim 1, wherein:
   said semiconductor substrate comprises a silicon substrate.

6. An optical semiconductor device, according to claim 2, wherein:
   said semiconductor substrate comprises a silicon substrate.

7. An optical semiconductor device, according to claim 3, wherein:
   said semiconductor substrate comprises a silicon substrate.

8. An optical semiconductor device, according to claim 1, wherein:
   said optical semiconductor element comprises a light-emitting element, and said semiconductor element region is provided with a semiconductor element for driving said light-emitting element.

9. An optical semiconductor device, according to claim 2, wherein:
   said optical semiconductor element comprises a light-emitting element, and said semiconductor element region is provided with a semiconductor element for driving said light-emitting element.

10. An optical semiconductor device, according to claim 5, wherein:
    said optical semiconductor element comprises a light-emitting element, and said semiconductor element region is provided with a semiconductor element for driving said light-emitting element.

11. An optical semiconductor device, according to claim 5, wherein:
    said optical semiconductor element comprises a light-emitting element, and said semiconductor element region is provided with a semiconductor element for driving said light-emitting element.

12. An optical semiconductor device, according to claim 8, wherein:
    said optical semiconductor element comprises a light-emitting element, and said semiconductor element region is provided with a semiconductor element for driving said light-emitting element.

13. An optical semiconductor device according to claim 3, wherein
    said V-groove is adapted to receive less than half of said optical fiber, whereby a height of a core of said optical fiber above said surface of said substrate corresponds to a light-emitting portion of said optical semiconductor element.

14. An optical semiconductor device according to claim 13, further
    comprising a mark provided on said substrate for positioning said optical semiconductor element.

15. An optical semiconductor device, comprising:
    a continuous semiconductor substrate having an optical element region and a semiconductor element region;
    an optical semiconductor element provided for one of light receiving and light emitting positioned over said optical element region;
    a peripheral circuit for one of manipulating a signal from said optical semiconductor element and manipulating a signal for said optical semiconductor element;

a V-notch within said optical element region; and a metal film which extends over all of said optical element region except in said V-groove and under said optical semiconductor element.

16. An optical semiconductor device, according to claim 15, wherein:

said optical semiconductor element is directly mounted on said semiconductor element region.

17. An optical semiconductor device, according to claim 15, wherein:

said semiconductor substrate includes a V-groove to hold an optical fiber to be optically connected with said optical semiconductor element.

18. An optical semiconductor device according to claim 17, wherein said V-groove is adapted to receive less than half of said optical fiber, whereby a height of a core of said optical fiber above said surface of said substrate corresponds to a light-emitting portion of said optical semiconductor element.

19. An optical semiconductor device, according to claim 15, wherein:

said optical semiconductor element comprises a light emitting element, and said semiconductor element region is provided with a semiconductor element for driving said light emitting element.

20. An optical semiconductor device according to claim 19, further comprising marks provided on said substrate for positioning said optical semiconductor element.

* * * * *